United States Patent [19]

Kalista et al.

[11] Patent Number: 4,914,388
[45] Date of Patent: Apr. 3, 1990

[54] DUAL OUTPUT SENSOR FOR DETECTING THE PROXIMITY OF A RECIPROCATING MEMBER

[75] Inventors: Daniel J. Kalista, Milwaukee; Earl T. Piber, Oconomowoc, both of Wis.

[73] Assignee: Eaton Corporation, Cleveland, Ohio

[21] Appl. No.: 213,400

[22] Filed: Jun. 30, 1988

[51] Int. Cl.[4] ............... G01B 7/14; H01H 15/14; H01H 35/38; G08C 19/06
[52] U.S. Cl. .................... 324/207.16; 137/554; 200/47; 324/236; 331/65; 361/180; 340/870.31
[58] Field of Search ........... 324/207, 208, 236; 200/47, 82 R; 307/309, 116; 331/65; 137/553, 554; 336/45, 130; 361/179, 180; 340/870.31, 870.32, 870.33

[56] References Cited

U.S. PATENT DOCUMENTS

| | | | |
|---|---|---|---|
| 1,344,898 | 7/1920 | Stevens et al. | 200/47 |
| 2,203,709 | 6/1940 | Weeks | 200/47 |
| 2,209,378 | 7/1940 | Barlow et al. | 200/47 |
| 2,384,631 | 9/1945 | Mace | 250/33 |
| 2,431,929 | 12/1947 | Goff | 74/100 |
| 2,490,040 | 12/1949 | Frerer | 200/47 |
| 2,683,779 | 7/1954 | Dishman | 200/47 |
| 2,838,625 | 6/1958 | Satchell | 200/47 |
| 2,867,697 | 1/1959 | Stroup | 200/47 |
| 2,914,626 | 11/1959 | Weishew | 200/47 |
| 2,964,601 | 12/1960 | Stockwell | 200/47 |
| 3,010,063 | 11/1961 | Rhoades | 324/207 X |
| 3,198,908 | 8/1965 | Staak | 200/92 |
| 3,472,977 | 10/1969 | Ziegler, Jr. | 200/47 |
| 3,825,809 | 7/1974 | Gatland et al. | 200/47 |
| 4,053,849 | 10/1977 | Bower et al. | 340/870.31 X |
| 4,162,387 | 7/1979 | De Candia | 219/79 |
| 4,230,023 | 10/1980 | Ward | 92/5 L |
| 4,307,271 | 12/1981 | Carli | 200/47 |
| 4,307,799 | 12/1981 | Zouzoulas | 200/47 |
| 4,316,145 | 2/1982 | Tann | 324/208 |
| 4,385,297 | 5/1983 | Schmitt et al. | 340/870.31 |
| 4,396,183 | 8/1983 | Lymburner | 269/32 |
| 4,543,527 | 9/1985 | Schuchmann et al. | 324/207 |
| 4,663,542 | 5/1987 | Buck et al. | 307/308 |
| 4,664,364 | 5/1987 | Lymburner | 269/32 |
| 4,667,147 | 5/1987 | Wiesgickl | 323/323 |
| 4,673,827 | 6/1987 | Sommer | 307/116 |
| 4,752,732 | 6/1988 | Van Schoiack et al. | 324/208 |

FOREIGN PATENT DOCUMENTS

| | | |
|---|---|---|
| 3318434 | 11/1984 | Fed. Rep. of Germany . |
| 3403961 | 8/1985 | Fed. Rep. of Germany . |
| 2339766 | 2/1976 | France . |
| 2550115 | 2/1985 | France . |

Primary Examiner—Gerard R. Strecker
Attorney, Agent, or Firm—J. G. Lewis

[57] ABSTRACT

A proximity switch assembly (10) for signaling the location of a movable member (36) at either of opposite end limits of movement relative to a stationary frame (44,46) includes a compact elongate housing (58) adapted to be mounted on the frame to extend along the path of movement of a power driven member (32), such as the piston rod of a hydraulic cylinder, which shifts the movable member between its end limits. The proximity switch is fixedly mounted in the housing and carries a switch actuating member (74) mounted for sliding movement over a relatively short distance sufficient to move two actuating targets (104,106) into an out of actuating proximity of respective air core proximity sensing coils (132,134) within the housing. Lost motion abutment structure (76,78) on the switch actuation member and power driven member (54) move into engagement with each other as a power driven member approaches each end of its stroke. Separate sensing circuits (156,158) provide discrete outputs associated with each end limit of travel of the movable member.

30 Claims, 7 Drawing Sheets

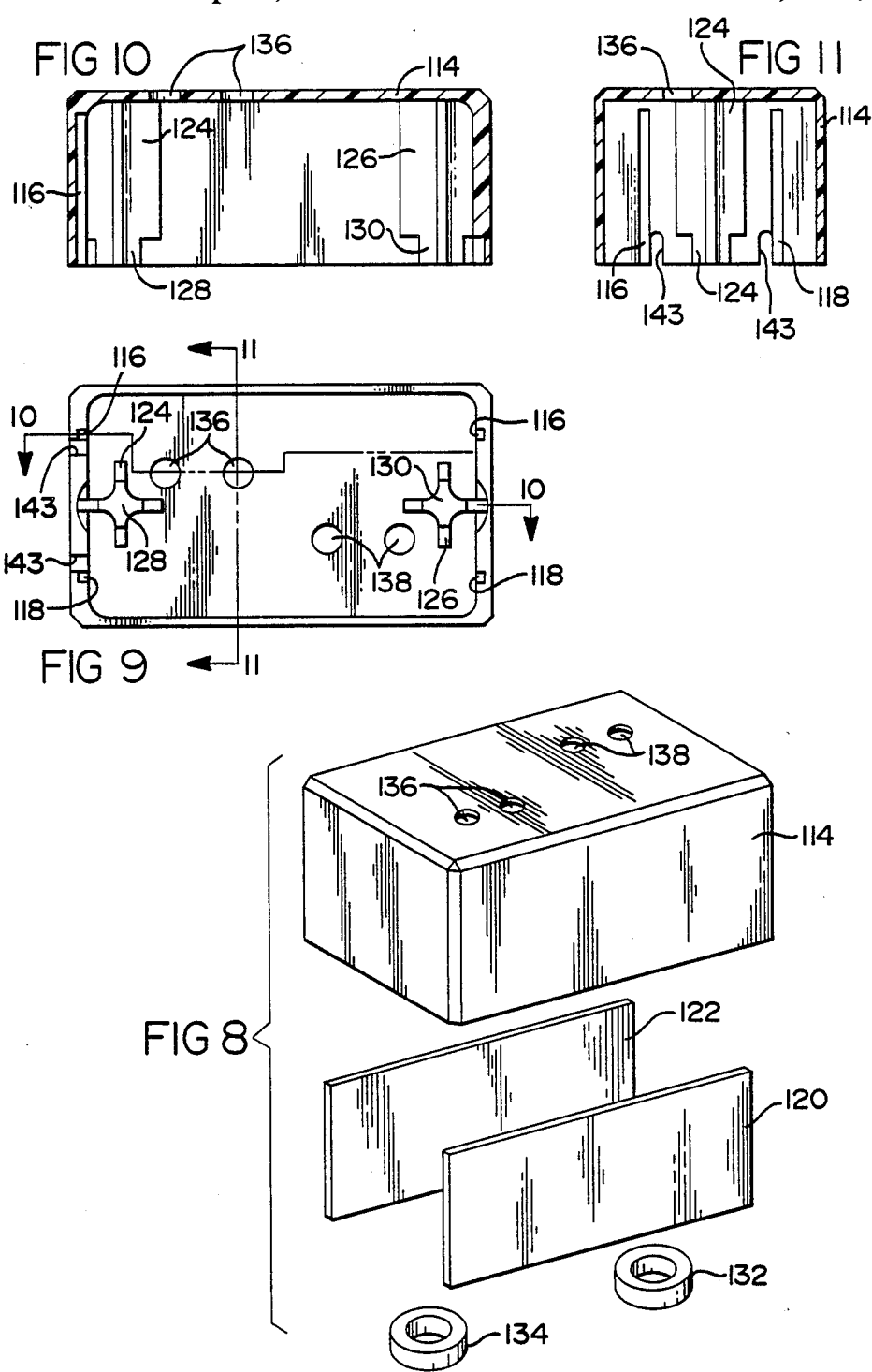

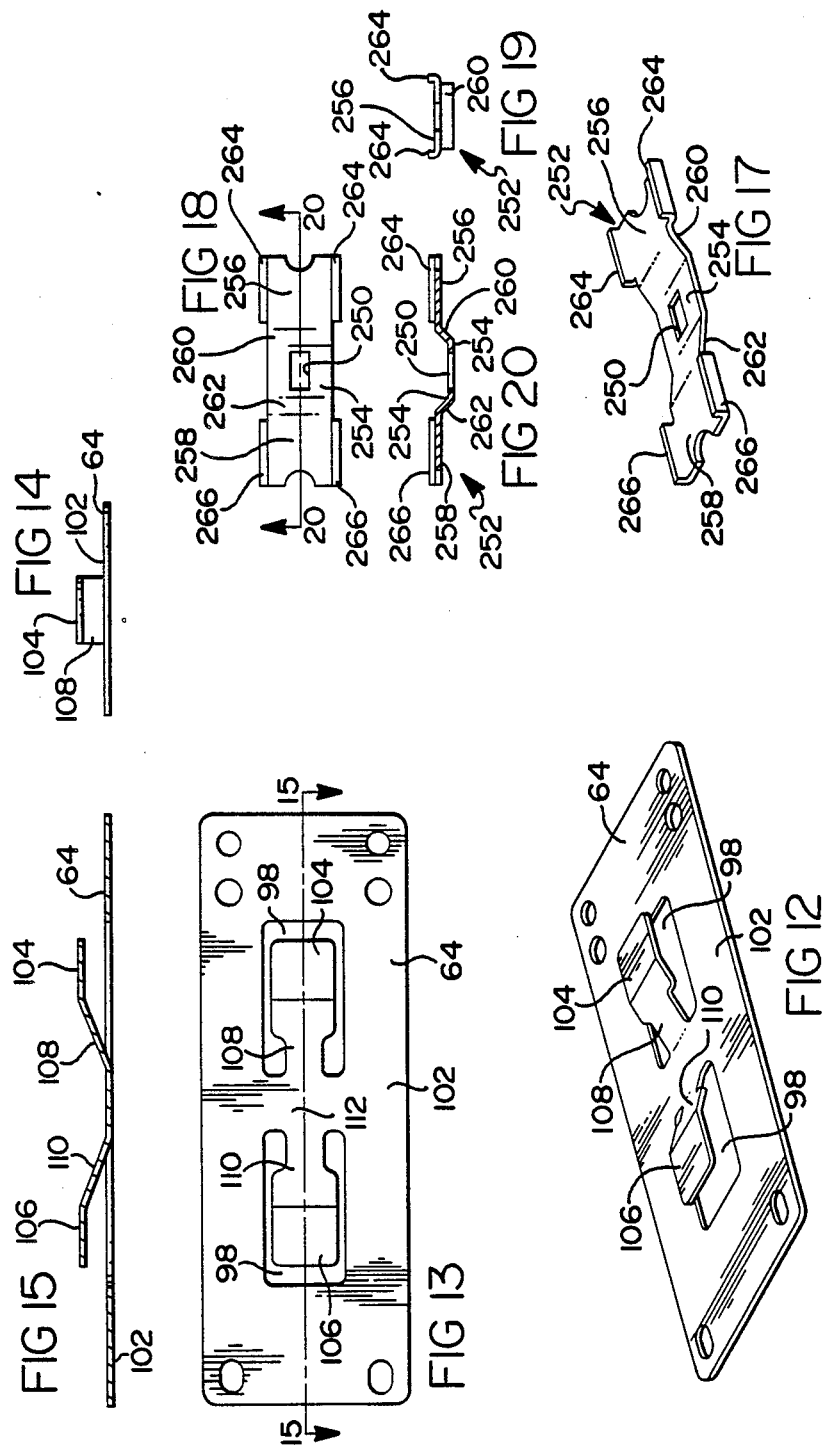

4,914,388

DUAL OUTPUT SENSOR FOR DETECTING THE PROXIMITY OF A RECIPROCATING MEMBER

TECHNICAL FIELD

The present invention relates to an apparatus for detecting the location of a movable member at either of two end limits of movement and is particularly directed to an inductive proximity switch of the type that utilizes an oscillator drive circuit in combination with an induction tank circuit to generate a target sensing field.

CROSS-REFERENCE TO RELATED APPLICATIONS

The present invention is related to that disclosed and claimed in U.S. Pat. No. 4,664,364 to Lymburner, entitled Proximity Switch Assembly and U.S. Pat. No. 4,543,527 to Schuchmann et al, entitled Proximity Switch Exhibiting Improved Start-Up Characteristics. This application is also related to copending applications USSN 133,755 entitled Inductive Proximity Switch Exhibiting Magnetic Field Immunity and USSN 133,819 entitled Circuit Board Holder for Proximity Sensor, which were both filed concurrently on Dec. 16, 1987 in the names of John P. Groves, Joseph Lazzaro, Gregory L. Nadolski and Donald L. Van Zeeland, and Dennis Leveque, respectively, and are assigned to the assignee of this application.

BACKGROUND OF THE INVENTION

Proximity switches are generally known in the art and have been widely applied to sense the position of a moving object in manufacturing processes. Such known proximity switches utilize an oscillator drive circuit in combination with an induction tank circuit. The tank circuit includes an induction coil as a means for sensing the presence of an object such as metal. The induction coil is constructed such that it generates a magnetic field in an area surrounding the coil. The magnetic field induces eddy currents in a conductive object which comes within the generated magnetic field. Such objects are known in the art as targets. Once a target comes within the magnetic field of the coil, energy is drawn from the induction coil. A typical induction proximity switch selects components of the oscillator and tank circuit to insure that oscillations occur when a target is absent from the magnetic field of the induction coil. When a target comes within the magnetic field of the induction coil, the oscillation amplitude is attenuated due to the loss of energy caused by eddy currents induced in the target. The amount of the oscillation attenuation is directly related to the distance between the target and the induction coil.

A predetermined distance between the induction coil and the target is selected as the point where the output of the proximity switch changes an electrical state to indicate the presence of a target. This distance is known as the switch trip point. A circuit within the proximity switch monitors the oscillation amplitude and generates a signal at the output of the proximity switch indicative of the fact that the target has come within the trip point distance.

Most inductive proximity switches employ a ferrite cup core and coil assembly as the transducer or sensing element. This is connected to an oscillator, usually operating between 100 and 600 KHz. The frequency is determined by the resonant frequency of the coil and a high quality tuning capacitor. A cup core is preferred because it allows for the flux field to be focused in front of the cup core, allowing a further sensing distance. The cup core, however, is a liability when used in high magnetic field environments, such as in or near the throat of a welder. The ferrite material saturates in these fields, causing the oscillator to damp because of the resulting tank Q degradation. This action makes the oscillator act as though a target is present. Prior art attempts to overcome this problem have employed innovative oscillator designs and oscillator detector and hold circuitry. This approach has been partially successful for the reason that the welding field is sinusoidal in nature and there is a time in every half cycle when the field is passing through zero. During this period, the oscillator is designed to rapidly build up and the detector responds rapidly, holding the detected voltage during the time the magnetic field builds up and damps the oscillator. While this can be accomplished satisfactorily, this type of oscillator is inherently more complicated and costly. In addition, there is still an upper limit as to the strength of magnetic field to which the current can be made immune.

There is presently an acute need for proximity switches which can be used in conjunction with pneumatic or hydraulic cylinders in automated manufacturing to detect when a host cylinder has reached either limit of travel. In automated manufacturing applications, particularly ganged welding of work pieces, numerous power actuated devices are employed, the actuation of which must be carefully choreographed for efficient work piece flow. Typically, separate proximity switches have been used for each actuator to separately detect each limit of travel. Because of the large number of proximity switches required, low cost and simplicity of design are paramount.

Another problem with prior art proximity switches lies in the fact that in adapting them for use with high pressure hydraulic cylinders, expensive and time consuming modification to the cylinders themselves must be made.

Still another problem of prior art proximity switches lies in the fact that the commercially available switch designs will not function properly when in close proximity to the extremely high electromagnetic fields generated by industrial welding operations. Shielding such proximity switches from external sources of electromagnetic energy has proven to be only partially effective and expensive.

A final problem with prior art proximity switches lies in their typical lack of overload detection and short circuit protection. When such features are available, they can be costly, complex and unreliable.

BRIEF DESCRIPTION OF THE INVENTION

The present invention provides a new and improved proximity switch of the type that utilizes a tank circuit energized by an oscillator drive circuit. The new apparatus in accordance with the present invention is designed to eliminate the need for two switches located at each end of a host power actuated device such as a hydraulic cylinder. The new apparatus is also designed to operate in close proximity to welding equipment and other sources of intense electromagnetic radiation and is effectively immune from the effects thereof.

The proximity detection switch of the present invention comprises means operative to change its conductive state in response to receipt of a control signal, two inductive circuit elements, means to electrically energize the inductive elements and thereby establish a substantially isolated flux field of a given amplitude about each element, each flux field being contained substantially within the atmosphere surrounding the inductive element. The proximity switch also includes first and second target means, each being displaceable between a position remote from its associated inductive element and a sensed position within the flux field adjacent or near the inductive element so as to effect a change in the field's amplitude, circuit means generating the control signal as a function of detected changes in the flux field amplitudes and, finally, means for displacing the first target means between positions as the member approaches a first limit of travel and displacing the second target means between positions as the member alternately approaches the second limit of travel. This arrangement provides discrete, opposite end of travel output signals from a single package which can be applied to a system logic network for redundancy or separate function inputs. The arrangement also provides a switch in which target position can be accurately controlled and, thus, the sensing distance minimized. Furthermore, use of an air coil provides almost unlimited magnetic field immunity because there is no ferrite core to saturate.

In the preferred embodiment, both search coils are entirely closed in a metallic housing in a mutually spaced relationship. Thus, each coil is protected from external side targets. An alternative construction is envisioned however, employing a non-metallic housing in which the coils are protected from the side targets by placing the coils in copper shields which act as remote shorted turns. This arrangement allows an apparatus which can be located extremely close to sources of intense electromagnetic energy and prevents significant inductive coupling between the coils.

According to another aspect of the invention, the proximity switch further includes means for selectively varying the characteristic field amplitude in a manner independent of the position of the target means. This arrangement has the advantage of permitting calibration and adjustment of the desired trip distance.

According to still another aspect of the present invention, means are provided to sense current flowing through the switch and operative to change its state from conductive to open when an overload current condition occurs. This deenergization of the output stage is regenerative, i.e., will continue as long as the sensed current exceeds a predetermined level. When the overload is removed, the output stage will again operate normally.

These and other features and advantages of the present invention will become apparent upon reading the following specification, which, along with the patent drawings, describes and discloses a preferred embodiment of the invention in detail.

A detailed description of the embodiment of the invention makes reference to the accompanying drawings.

BRIEF DESCRIPTION OF THE DRAWINGS

FIG. 5a is a cross sectional side view of a segment of the proximity switch taken on lines 5a—5a of FIG. 4 on a further enlarged scale;

FIG. 8 is an exploded perspective view of a housing liner of the proximity switch of FIG. 1 on an enlarged scale with the circuit boards and inductors arranged therewith;

FIG. 9 is a bottom plan view of the housing liner of FIG. 8;

FIG. 10 is a cross sectional side view of the housing liner taken on lines 10—10 of FIG. 9;

FIG. 11 is a cross sectional end view of the housing liner taken on lines 11—11 of FIG. 9;

FIG. 12 is a perspective view of a target shim of the proximity switch of FIG. 1 on an enlarged scale;

FIG. 13 is a top plan view of the target shim of FIG. 12;

FIG. 14 is an end plan view of the target shim of FIG. 12;

FIG. 15 is a cross sectional view of the target shim taken on lines 15—15 of FIG. 13;

FIG. 16 is a cross sectional side view of an alternative embodiment of the proximity switch of FIG. 5;

FIG. 17 is a perspective view of a target member of the proximity switch of FIG. 16;

FIG. 18 is a bottom plan view of the target member of FIG. 17.

FIG. 19 is an end plan view of the target member of FIG. 17; and

FIG. 20 is a cross sectional view of the target member taken on lines 20—20 of FIG. 18.

DETAILED DESCRIPTION OF THE PREFERRED AND ALTERNATIVE EMBODIMENTS OF THE INVENTION

Figure 1:
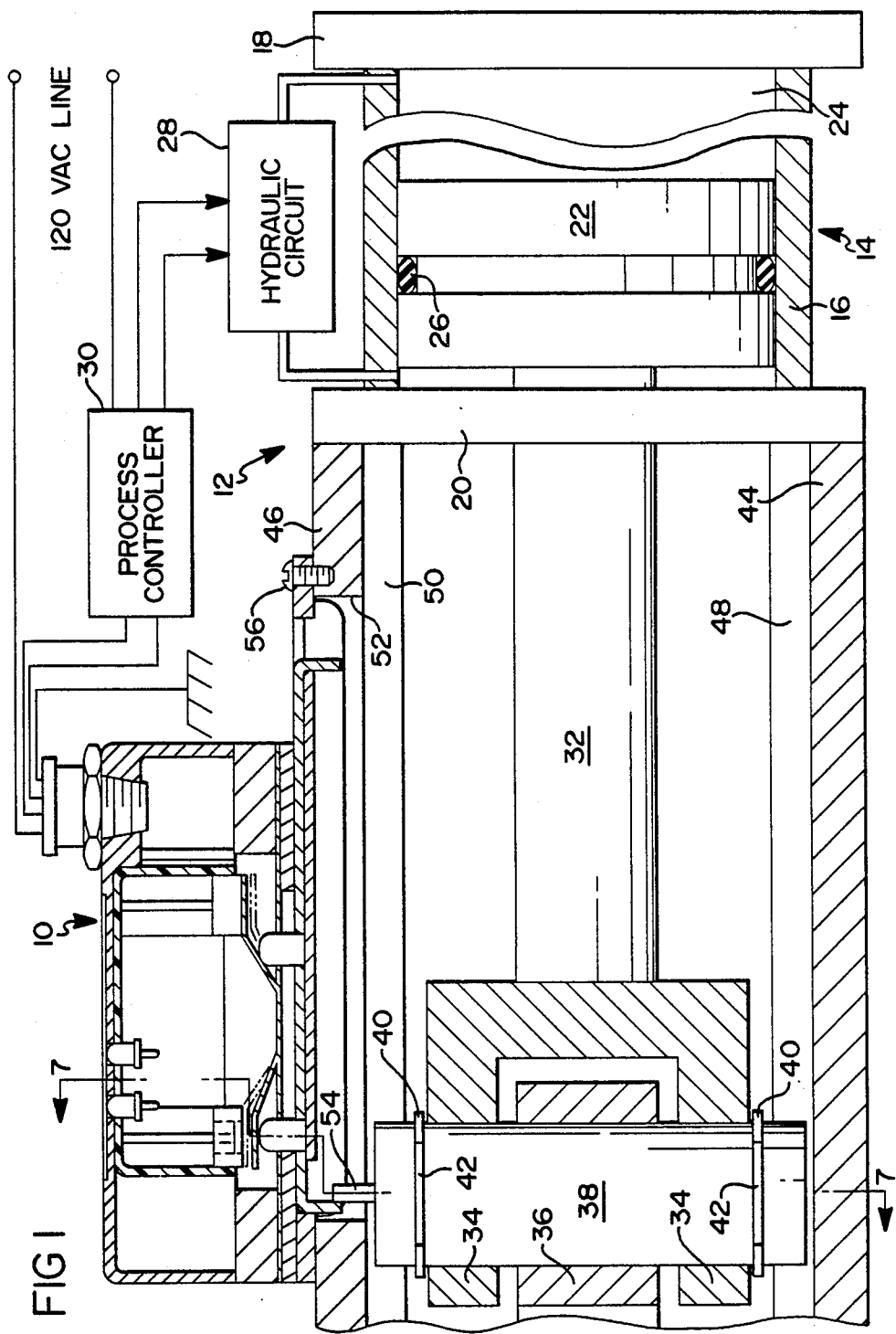
FIG. 1 is an assembly in cross section of a proximity switch made in accordance with the present invention in combination with a power actuated device.
Figure 2:
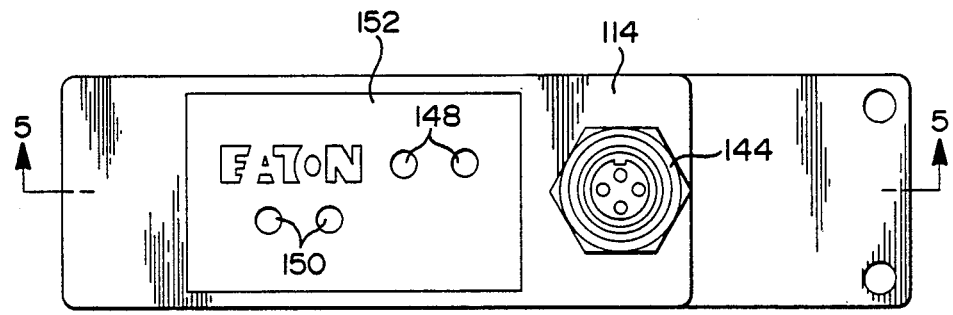
FIG. 2 is a top plan view of the proximity switch of FIG. 1 on an enlarged scale.
Figure 3:
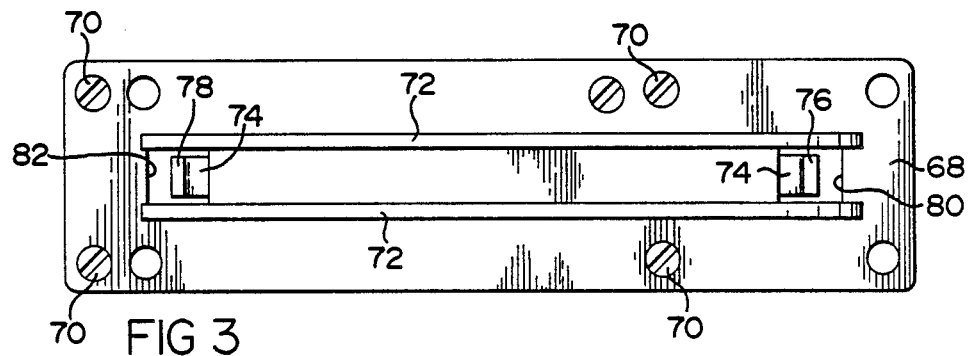
FIG. 3 is a bottom plan view of the proximity switch of FIG. 1 on the scale of FIG. 2.
Figure 4:
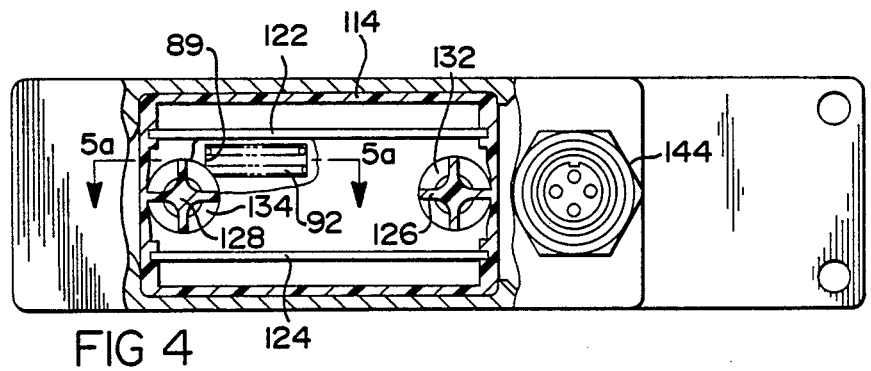
FIG. 4 is a top plan view of the proximity switch of FIG. 2 with portions thereof broken away to reveal internal details thereof.
Figure 7:
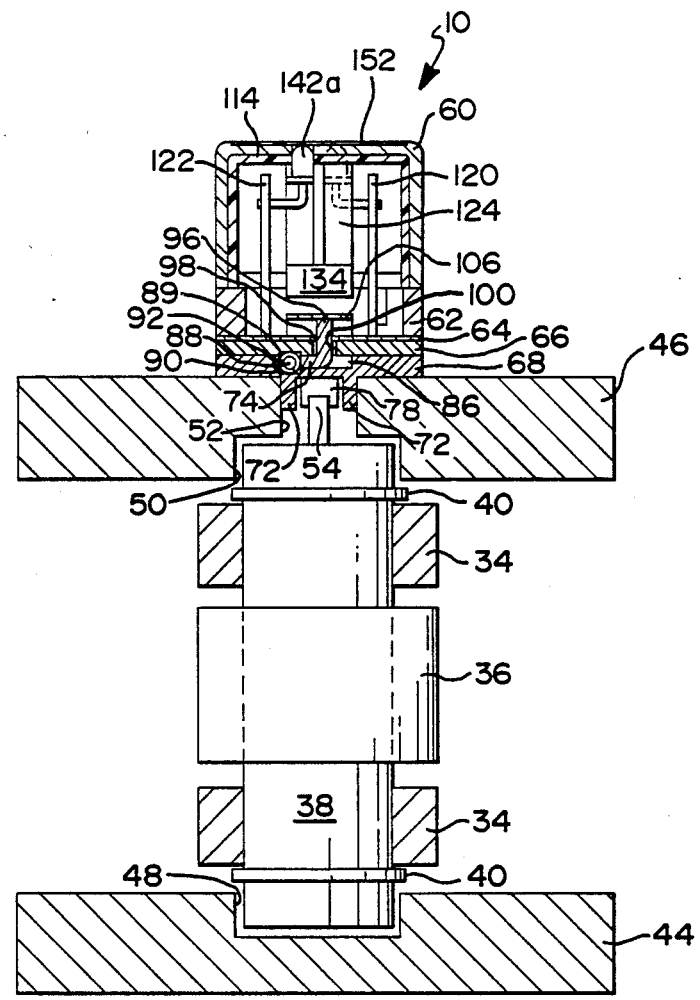
FIG. 7 is a cross sectional view of the proximity switch taken on lines 7—7 of FIG. 1.

Referring to FIGS. 1 and 7, a proximity switch 10 is shown in assembly with a power actuated device 12. In the preferred embodiment of the invention, device 12 comprises a hydraulic cylinder including a housing assembly 14 made up of a cylindrical wall member 16 closed at each end by caps 18 and 20. A piston 22 is slidably disposed within cavity 24 defined by wall member 16. Piston 22 carries an annular seal 26 at the interface of the circumference of piston 22 and the inner diameter surface of wall member 16.

Device 12 is controlled by a hydraulic circuit 28 which is in fluid communication with portions of cavity 24 on each side of piston 22 to effect controlled displacement of piston 22 between a first limit of travel (illustrated) wherein piston 22 is nearly contacting end cap 20 and a second limit of travel wherein piston 22 is displaced rightwardly from its illustrated position and is nearly contacting end cap 18. Hydraulic circuit 28 is controlled by a process controller 30 which receives device position feedback information from proximity switch 10. The specific design details of hydraulic circuit 28 and process controller 30 are not deemed germane to the present invention and are deleted here for the sake of brevity.

A piston rod 32 is carried by piston 22 and extends axially outwardly from housing assembly 14 through end cap 20, terminating in a bifurcated yoke 34 which is interconnected with a structural link member 36 through a pin 38. Pin 38 is held in its illustrated position with respect to yoke 34 by C-clips 40 disposed within outwardly opening circumferential slots 42 formed in pin 38.

Power actuated device 12 also includes parallel housing extensions or rails 44 and 46 extending from end cap 20 and straddling piston rod 32. Rails 44 and 46 have axially directed inwardly opening elongated slots 48 and 50, respectively for receiving the opposed outwardly projecting ends of pin 38. As can best be seen in FIG. 7, slots 48 and 50 allow piston 22, piston rod 32, yoke 34, link member 36 and pin 38 to move axially between the first and second limits of travel but prevent rotation thereof. This arrangement guides and supports the distal end of piston rod 32 in straight line movement throughout its entire stroke.

It is contemplated that link member 36 will engage an apparatus employed in a manufacturing process such as a power actuated clamp described in U.S. Pat. No. 4,664,364 the specification of which is incorporated herein by reference.

Proximity switch 10 nests within an elongated slot 52 within rail 46. Slots 50 and 52 are in register, receiving a pin 54 extending axially upwardly from pin 38 within slot 52. Proximity switch 10 is affixed to rail 46 by screws 56 or other suitable fastening means.

Figure 5:
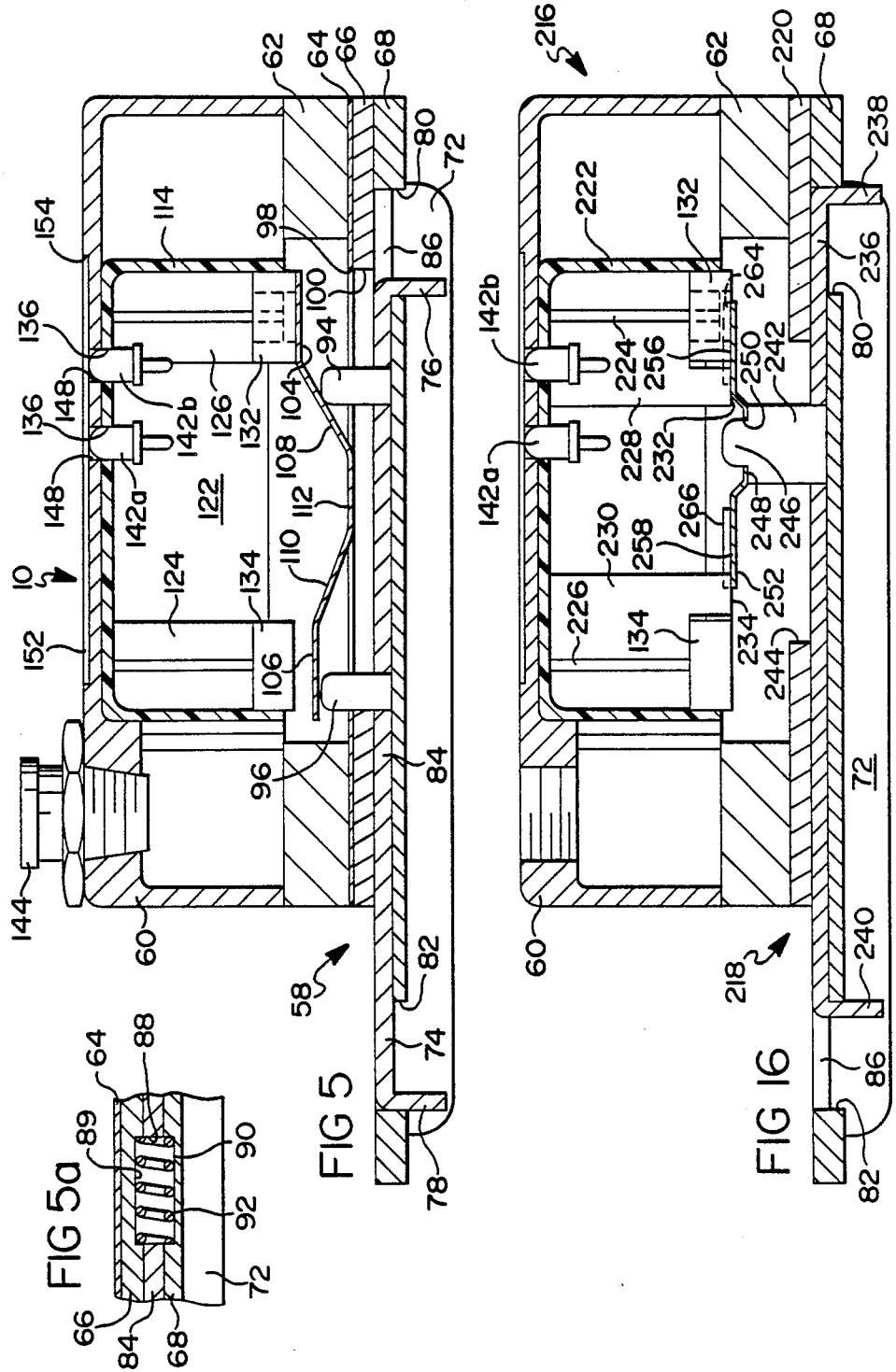
FIG. 5 is a cross sectional side view of the proximity switch taken on lines 5—5 of FIG. 2 on a further enlarged scale.

Referring to FIGS. 2-5, 5a, and 8-15, the structural details of proximity switch 10 are illustrated. Proximity switch 10 includes a generally rectangular elongate housing assembly 58 including a cover member 60, a spacer 62, a target shim 64, a mounting plate 66 and a base member 68 held in assembly by suitable fastening means such as screws 70. The constituent parts of housing assembly 58 are preferably formed of metal to shield internal components from external electromagnetic fields typically present in many manufacturing processes. However, it is contemplated that such components could be formed from plastic or other suitable non-metallic material if alternative shielding is provided such as by metal foil cladding. Base member 68 has two downwardly extending guide members 72 integrally formed therewith which, in assembly, extend within slot 52 for positioning of housing assembly 58 with respect to rail 46. Guide members 72 are laterally spaced to receive an elongated slide or carrier member 74 therebetween. Carrier member 74 has two abutment shoulders 76 and 78 integrally formed therewith extending downwardly through registering openings 80 and 82 in base member 68 and into slot 52 of rail 46. As will be described in detail hereinbelow, abutment shoulders 76 and 78 are integrally formed within carrier member 74 proximate the ends thereof and extend far enough into slot 52 to entrap the uppermost end of pin 54. Carrier 74 has a main body portion 84 slidably disposed in an elongated slot 86 interconnecting openings 80 and 82 within base member 68. Thus, carrier 74 is held in its illustrated position between the interface of mounting plate 66 and base member 68 while retaining limited freedom of sliding displacement. In FIG. 5, carrier 74 is illustrated in its left-handmost limit of travel wherein shoulders 76 and 78 abut the respective edges of openings 80 and 82 of base member 68.

Registering opposed elongated slots 88, 89 and 90 are formed respectively through the body portion 84 of carrier 74 and within the lower surfaces of mounting plate 66, and the upper surface of base 68 within slot 86. As best seen in FIG. 5a, a compression spring 92 is disposed within the elongated rectangular cavity collectively defined by slots 88, 89 and 90, simultaneously bearing against the respective ends thereof to urge carrier 74 toward a center of travel position, midway between its left-handmost limit of travel (illustrated in FIG. 5) and its right-handmost limit of travel. Thus, when pin 54 is contacting neither of the abutment shoulders 76 and 78, spring 92 will return carrier 74 to its central position. When pin 54 displaces body portion 84 of carrier member 74 leftwardly with respect to mounting plate 66 and base member 68, slot 88 will become offset from slots 89 and 90, thereby compressing spring 92. Likewise when pin 54 displaces body portion 84 rightwardly with respect to mounting plate 66 and base member 68, slot 88 will also become offset from slots 89 and 90, thereby compressing spring 92. As described hereinabove, whenever spring 92 is compressed in either axial direction, it will tend to bias carrier member 74 toward its center of travel position illustrated in FIG. 5a.

Two spaced abutment tabs 94 and 96 are integrally formed with carrier 74 for sliding movement therewith and extend upwardly through registering apertures 98 and 100 formed in target shim 64 and mounting plate 66, respectively. Target shim 64 is constructed of thin spring steel or other suitable material and includes a body portion 102 and two target surfaces or portions 104 and 106 integrally formed with body portion 102 through neck regions 108 and 110 to assume the configuration illustrated in FIGS. 12-15 in the relaxed or unbiased condition. With the exception of a bridge portion 112, target surfaces 104 and 106 and neck regions 108 and 110, body portion 102 of target shim 64 is rigidly retained between spacer 62 and mounting plate 66. Abutment tabs 94 and 96 selectively bear against the under surface of targets 104 and 106 and neck regions 108 and 110, respectively, as a function of the position of carrier 74. A liner 114 molded of electrically insulating material such as Nylon is illustrated in detail in FIGS. 8-11 and is nestingly received within cover member 60 as illustrated in FIG. 5. Liner 114 serves to insulatively retain and position the electrical components of proximity switch 10 within its generally rectangular shaped structure as will be described hereinbelow. Liner 114 has two sets of vertically extending opposed slots 116 and 118 formed therein for receiving printed circuit boards 120 and 122, respectively. Liner 114 also has two downwardly extending bosses 124 and 126 integrally molded therewith which are formed generally in an +—shaped cross section having a dimensional step reduced portion 128 and 130, respectively, at the lowermost end thereof for receiving generally toroidal shaped coils 132 and 134. Various circuit components are affixed on printed circuit boards 120 and 122 as will be described hereinbelow. Those components, including coils 132 and 134 comprise a circuit described in detail with respect to drawing FIG. 6. Liner 114 includes two pairs of apertures 136 and 138 for receiving LED pairs 140a and b and 142a and b, respectively, carried by PC boards 120 and 122. Liner 114 also includes conductor routing passages 143 molded in one end thereof. Upon assembly, it is contemplated that liner 114 would be filled with a suitable potting material such as epoxy to retain and protect the various electrical components from vibration and contamination. Coils 132, 134 could be held in place during assembly by snap action tabs (not illustrated) formed on liner 114 capturing a coil bobbin or, alternatively, providing a slight interference fit between the bobbin ID and boss portions 128, 130. The potting material could permanently retain coils 132, 134 in their illustrated positions. Care must be taken so the bottom surfaces of coils 132, 134 are nearly coplanar and that the potting material does not degrade or effect operation of coils 132, 134 and target surfaces 104, 106.

In assembly, bosses 124 and 126 are spaced from one another and position coils 132 and 134 in a relationship whereby the electromagnetic field generated by each when energized has negligibly effect upon the other. Furthermore, coil 132 is arranged so that its axis of symmetry is vertically oriented and passes normally through a plane defined by target surface 104. Likewise, the axis of symmetry of coil 134 is vertically oriented and passes normally through the plane defined by target surface 106. When carrier member 74 assumes a neutral position, i.e. when unaffected by pin 54 contacting either abutment shoulder 76 or 78, spring 92 will position carrier 74 centrally between its limits of travel thereby positioning tabs 94 and 96 horizontally centrally under target surfaces 104 and 106. As described hereinabove, neck portions 108 and 110 serve as spring means to bias target surfaces 104 and 106 into a position where they are spaced vertically downwardly from coils 132 and 134, as is the case with coil 134 and target surface 106 in FIG. 5.

In application, when pin 54 contacts abutment shoulder 78 pushing it leftwardly to its end limit of travel as illustrated in FIG. 5, abutment tabs 94 and 96 move leftwardly with carrier member 74. Abutment tab 96 slidingly contacts the under surface of target surface 106 but does not alter its vertical position with respect to coil 134. However, as carrier member 74 transitions from its central position to its left-handmost limit of travel, tab 94 contacts neck region 108 of target shim 64 and ramps therealong overcoming the inherent biasing effect and displacing target surface 104 upwardly until it contacts the under surface of coil 132. Definitionally, when target surfaces 104 and 106 are in contacting relationship with their respective coils 132 and 134, they are deemed to be in a sensed position and when they are spaced from their respective coils 132 and 143, they are deemed to be in a remote position, the significance of which will be described hereinbelow. As the power actuated device 12 transitions from left to right as illustrated in FIG. 1 from its left-handmost limit of travel to its right-handmost limit of travel, pin 54 will no longer abut shoulder 78 and carrier member 74 will assume its central or neutral position during a dwell period during which pin 54 traverses the spaced area between shoulders 78 and 76. When pin 54 contacts shoulder 76, it displaces carrier member 74 rightwardly as viewed in FIG. 5. During the dwell period, tab 94 will have moved rightwardly ramping up neck 108 whereby target surface 104 will be in the remote position. When pin 54 contacts shoulder 76, displacing it rightwardly toward its right-handmost limit of travel, tab 96 will contact neck portion 110, displacing target surface 106 vertically from its remote to its sensed position. The sloping arrangement of neck portions 108 and 110 permit a certain amount of over-travel of carrier member 74 without altering the positioning of target surfaces 104 and 106.

Cover member 60 has an industrial quality four pin connector 144 mounted thereon for interfacing proximity switch 10 with process controller 30 and a source of line voltage. Within proximity switch 10 one of the lines from connector 144 is grounded to cover member 60 by welding, soldering or other suitable means. The remaining three lines are routed to and electrically interconnected with an electronic circuit 146 via passages 143, shown schematically in FIG. 6, the components of which are carried by circuit boards 120 and 122. Referring to FIGS. 2, 5 and 7-9 LEDs 140 and 142 extend through apertures 136 and 138 of liner 144 as well as registering apertures 148 and 150, respectively, in the top of cover member 60 to permit an operator to observe certain operating conditions of proximity switch 10, as will be described hereinbelow. An optically transparent or translucent label 152 is adhesively retained within a pocket 154 formed on the top surface of cover member 60. Label 152 serves to carry advertising or instructional indicia thereon while serving as a protective lens covering for windows/apertures 148 and 150.

Although target surfaces 104 and 106 are illustrated as alternatively contacting coils 132 and 134, it is contemplated that a thin protective barrier could be provided without materially altering operation of proximity switch 10.

Figure 6:
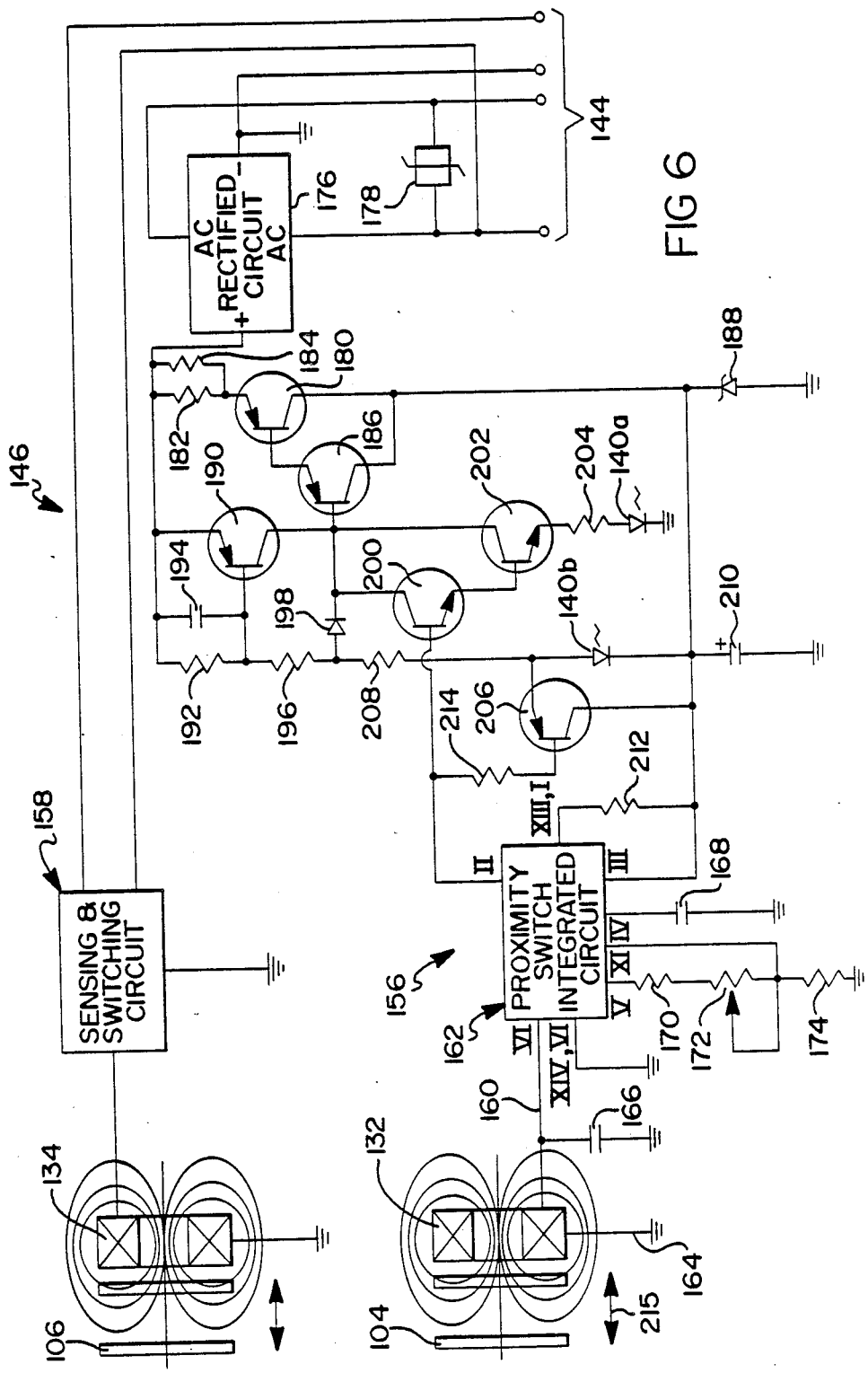
FIG. 6 is a schematic representation of the circuit of the proximity switch of FIG. 1.

Referring to FIG. 6, circuit diagram 146 of proximity switch 10 is illustrated. The applicants have found that the apparatus described hereinabove permits extremely accurate positioning of target surfaces 104 and 106 with respect to coils 132 and 134, permitting a minimum sensing distance. The use of air coils 132 and 134, lacking a ferrite core which can saturate, provides almost unlimited magnetic field immunity. Because coils 132 and 134 are substantially enclosed in metallic housing assembly 58, they are protected from external side targets. The various test and performance data discussed in the above identified and incorporated copending applications are deemed equally applicable to the present invention.

Referring to FIG. 6, two separate sensing and switching circuits, designated 156 and 158 are dedicated to coils 132 and 134, respectively, and are electrically interconnected only at the outputs of terminal 144 for interconnection with process controller 130 and line voltage as described in FIG. 1. Circuit 156 is replicated in circuit block 158 of FIG. 6. Only circuit 156 will be described in detail for the sake of brevity, it being understood that the structure and performance of circuit 158 is substantially identical.

Referring to FIG. 6, lead 160 of coil 132 is connected to input terminal VI of a proximity switch integrated circuit 162. Lead 164 of coil 132 is connected to ground. The operation of circuit 162 is described in U.S. Pat. No. 4,543,527, the specification of which is incorporated herein by reference. Input terminal VI of IC 162 is interconnected to ground through a 2.2 nanofarad capacitor 166. Terminals XIV and VII of IC 162 are connected directly to ground and terminal IV is interconnected to ground through a 0.01 microfarad detector capacitor 168 which maintains tank oscillation amplitude. Terminal V of IC 162 is interconnected to ground through a series combination of a 8.2k resistor 170, the fixed resistance portion of a 2k potentiometer 172 and a 330 ohm resistor 174. Terminal XI of IC 162 is interconnected to the point of common connection of potentiometer 172 and resistor 174 as well as the wiper of potentiometer 172. The inputs from connector 144 are electrically connected to the AC input terminals of a 400 volt type VM48 rectifier manufactured by Varo 176. The AC terminals of rectifier 176 are bridged by a 220 volt varistor 178 for transient protection. The negative output terminal of rectifier 176 is connected to ground and to one of the remaining terminals of connector 178. The positive output terminal of rectifier 176 is interconnected to the emitter of an MPSA92 transistor 180 through a parallel combination of a 5.1 ohm resistor 182 and a 10 ohm resistor 184. Transistor 180 is connected as part of a Darlington pair with a second transistor 186 with the common collectors thereof connected to ground through a reverse biased 7.5 volt 1 watt zener diode 188. The positive output terminal of rectifier 176 is also directly connected to the emitter junction of a type MPSA63 transistor 190 and to the base of transistor 190 through a parallel combination of an 18k ohm resistor 192 and a 0.001 microfarad capacitor 194. The base of transistor 190 is interconnected with the base of transistor 186 and the collector of transistor 190 through a series combination of a 10k ohm resistor 196 and a forward biased diode 198. The bases of transistors 190 and 186 are commonly connected to the collectors of the Darlington type MPSA42 transistor pair 200 and 202. The emitter junction of transistor 202 is interconnected to ground through a series combination of a 1.5k ohm resistor 204 and a green type HLMP17178 LED 142a.

The point of common connection between resistor 196 and the anode of diode 198 is interconnected to the emitter junction of a type 2N31786 transistor 206 through a 56k ohm resistor 208. The emitter of transistor 206 is interconnected to ground through a series connected type HLMP1700 red LED 140b and a 2.2 microfarad electrolytic capacitor 210. The cathode of LED 140b is connected to the cathode of zener diode 188, to the collector of transistor 206, to terminal III of IC 162 and interconnected to terminals I and XIII of IC 162 through a 330k ohm resistor 212. The base of transistor 200 is electrically connected to output terminal II of IC 162 and interconnected to the base of transistor 204 through a 100k ohm resistor 214.

Potentiometer 172 is employed to set nominal trip distance. The output of IC 162 pin II is held low when the oscillator is active i.e. target 104 remote from coil 132. As target 104 is moved towards coil 132 as indicated by arrow 215, the oscillator is damped and the output at pin II is released and allowed to go high. When this happens, Darlington transistors 200 and 202 switch on green LED 140a, pulling base current through the Darlington 180, 186 output stage, thus causing load current to flow through bridge 176 the output stage and zener 188. Transistor 190 is employed to monitor the voltage drop across the 3.3 ohm sampling resistor (182 and 184) and the two output stage $V_{be}$ drops. If the load current becomes excessive the cathode of diode 198 drops sufficiently to conduct and thus de-energize the output stage regeneratively. Current flows through the overload LED 104b since the LED bypass transistor 206 is de-energized because pin II is still high. When the overload is removed, the output stage will again operate normally. With the value shown, the output is rated for 100ma before overload takes place.

Referring to FIGS. 16-20, an alternative embodiment of the present invention is illustrated. An alternative design proximity switch 216 mounts to and interfaces with power actuated device 12, process controller 30 and hydraulic circuit 28 of FIG. 1 in the same way as the preferred proximity switch 10. For the sake of brevity, only the areas where significant structural or functional differences between switches 10 and 216 exist will be described in detail. Proximity switch 216 includes a housing assembly 218 including cover member 60, spacer 62 a mounting plate 220 and base member 68 held in assembly by suitable fastening means such as screws (not illustrated). An insulating liner 220 is nestingly disposed within cover member 60 and is substantially identical to liner 114 with the exception that liner 222 includes two downwardly extending integrally molded bosses 224 and 226 which are generally +−shaped in cross section and include stepped portions for receiving coils 132 and 134, but also include opposed inwardly directed extended web extensions 228 and 230, respectively. Web extensions 228 and 230 extend downwardly as viewed in FIG. 16 at the outermost extent thereof externally of coils 132 and 134 to define a bearing surface 232 and 234, respectively, the function of which will be described hereinbelow.

A carrier member 236 is disposed within slot 86 of base member 68 and includes two downwardly projecting abutment shoulders 238 and 240 extending through openings 80 and 82, respectively. A carrier tab 242 is integrally formed with carrier member 236 and extends upwardly therefrom through an elongated aperture 244 in mounting plate 220. Tab 242 has an upper end of reduced dimension 246 dimensionally transitioning with the balance of tab 242 through a step 248. End 246 of tab 242 extends through a like shaped aperture 250 in a slide target member 252 best illustrated in FIGS. 17-20. Member 252 is preferably formed from a single piece of suitable material such as spring steel shaped generally as an elongated rectangle with aperture 250 centrally disposed therein. Member 252 has a central region 254 disposed intermediate two target surfaces 256 and 258 interconnected to central region 254 through intermediate sloped transition regions 260 and 262, respectively. Upstanding laterally opposed stiffener/locator ribs 264 and 266 straddle target surfaces 256 and 258, respectively.

As best viewed in FIG. 16, in assembly, slide target member 252 serves to define separate target surfaces for coils 132 and 134. Target member 252 is carried for sliding displacement with member 236. Transition regions 260 and 262 serve as leaf springs to bias central region 254 downwardly against step 248 and simultaneously bias target surfaces 256 and 258 upwardly against bearing surfaces 232 and 234, respectively. Stiffener/locator ribs 264 and 266 are dimensioned to straddle coils 132 and 134 to permit relative sliding displacement with respect thereto but prevent relative rotational displacement, thereby insuring precise axial alignment of coils 132 and 134 with their respective target surfaces 256 and 258, respectively, when the targets are in their sensed position overlying a substantial portion of the underside of their respective coils 132 and 134. With carrier member 236 in the position illustrated in FIG. 16, target surface 256 overlies substantially all of coil 132 and is definitionally in the sensed position. Simultaneously, surface 258 is disposed at an axial offset from coil 134 and definitionally is in its remote position. When carrier member 236 is displaced leftwardly from its illustrated position, tab 242 and slide target member 252 are displaced leftwardly whereby target surface 258 overlies a substantial portion of the underside of coil 134 while target surface 256 bears upwardly against bearing surface 232 and is in its remote position. Coils 132 and 134 are electrically interconnected with circuit 146 as described hereinabove.

Proximity switch 216 also includes a dwell or neutral return spring (not illustrated) disposed within registering slots within mounting plate 220, carrier member 236 and base member 68 as in the case of the preferred embodiment of the invention (refer FIG. 5a).

It is to be understood that the invention has been described with reference to specific embodiments to provide the features and advantages previously described and that such specific embodiments are susceptible of modification, such as will be apparent for those skilled in the art. For example, the carrier centering spring 92 and slots 88, 89 and 90 could be reconfigured to effect carrier biasing to either carrier end limit of travel, providing a bistable proximity switch 10. Accordingly, the foregoing is not to be construed in a limiting sense.

What is claimed is:

1. A proximity switch for use with a power actuated device including a member mounted for movement between first and second limits of travel, said switch comprising:
   means operative to change conductive state in response to a control signal;
   first and second inductive circuit elements;
   means operative to electrically energize said inductive elements to establish substantially isolated flux fields thereabout, each said field disposed within the atmosphere surrounding its respective element and having a characteristic amplitude;
   first target means displaceable between a position remote from said first inductive element and a sensed position adjacent said first element to effect a change in said first element characteristic amplitude;
   second target means displaceable between a position remote from said second inductive element and a sensed position adjacent said second element to effect a change in said second element characteristic amplitude;
   circuit means operative to generate said control signal as a function of said change in at least one of said characteristic amplitudes; and
   means operatively engaging said member and said first and second target means to effect simultaneous reciprocal displacement of said first and second target means between said respective remote and sensed positions when said member alternately substantially arrives at one of its end limits of travel.

2. The switch of claim 1, wherein said means for displacing said first and second target means is further operative to displace said first target means between said positions as said member departs said first limit of travel and to displace said second target means between said positions as said member alternately departs said second limit of travel.

3. The switch of claim 1, wherein said means for displacing said first and second target means comprises means to bias said first and second target means into one of said respective positions.

4. The switch of claim 3, wherein said target biasing means is operative to simultaneously bias said first and second target means toward said respective remote positions.

5. The switch of claim 3, wherein said target biasing means is operative to simultaneously bias both said target means into said respective remote positions as said member traverses a dwell region intermediate said first and second limits of travel.

6. The switch of claim 1, wherein said first and second target means simultaneously reciprocally transition between said respective positions.

7. The switch of claim 1, further comprising means operative to shield said fields from external sources of electromagnetic energy.

8. The switch of claim 7, wherein said shield means comprises a metallic housing substantially enclosing said inductive elements.

9. The switch of claim 8, wherein said target displacing means carries said first and second target means substantially within said housing.

10. The switch of claim 7, wherein said shield means comprises a metallic liner disposed within a non-metallic housing, said liner and first and second means coacting to substantially enclose said inductive elements.

11. The switch of claim 1, wherein said first and second target means are constructed of ferrous material.

12. The switch of claim 1, wherein the dimensional spacing of said member limits of travel substantially exceeds the dimensional spacing of both said target means remote and sensed positions.

13. The switch of claim 1, further comprising means for selectively varying said characteristic amplitudes independent of the position of said target means.

14. The switch of claim 1, wherein said inductive elements comprise first and second air coils.

15. The switch of claim 14, wherein said air coils are generally toroidal in shape, each having a principle axis and said respective target means comprise generally planar ferrous metal members displaceable along said axis.

16. The switch of claim 15, wherein said coils and target members are generally dimensionally coextensive on respective planes normal to said axes.

17. The switch of claim 14, wherein said air coils are generally toroidal in shape, each having a principle axis and said respective target means comprise a generally planar ferrous metal member displaceable transversely to said axes.

18. The switch of claim 17, wherein said coils and target members are generally dimensionally coextensive on respective planes normal to said axes.

19. The switch of claim 1, further comprising means operative to sense current flowing through said means operative to change conductive state when said means is in a closed state and to generate an overload current condition signal when said sensed current exceeds a predetermined level, said overload current condition signal being operative to change said means to an open state.

20. The switch of claim 19, further comprising means operative to generate a user sensible signal in response to said overload current condition signal.

21. The switch of claim 20, further comprising means operative to generate a user sensible signal as a function of the conductive state of said means operative to change conductive state.

22. In combination:
   a power actuated device including a rigid member mounted within a fixed frame for movement along a fixed path relative to said frame between a first end limit of travel and a second end limit of travel, power actuated means for driving said rigid member in either direction from one of said end limits to the other; and a proximity switch for signaling the arrival of said member at each of said end limits, said switch comprising, means operative to change conductive state in response to a control signal, first and second inductive circuit elements, means operative to electrically energize said inductive elements to establish substantially isolated flux fields thereabout, each said field disposed within the atmosphere surrounding its respective element and having a characteristic amplitude, first target means displaceable between a position remote from said first inductive element and a sensed position adjacent said first element to effect a change in said first element characteristic amplitude, second target means displaceable between a position remote from said second inductive element and a sensed position adjacent said second element to effect a change in said second element characteristic amplitude, circuit means operative to generate said control signal as a function of said change in said characteristic amplitudes, and means operatively engaging said member and said first and second target means to effect simultaneous reciprocal displacement of said first and second target means between said respective remote and sensed positions when said member alternately substantially arrives at one its end limits of travel.

23. The combination of claim 22, wherein said power actuated device comprises a fluid driven cylinder.

24. The combination of claim 23, wherein said fluid driven cylinder comprises a hydraulic cylinder.

25. The combination of claim 23, wherein said fluid driven cylinder comprises a pneumatic cylinder.

26. In combination:

a power actuated device including a rigid member mounted within a fixed frame for movement along a fixed path relative to said frame between a first end limit of travel and a second end limit of travel, power actuated means for driving said rigid member in either direction from one of said end limits to the other; and a proximity switch for signaling the arrival of said member at each of said end limits, said switch comprising, means operative to change conductive state in response to a control signal, a housing fixedly mounted upon said frame in surrounding relationship to a slot extending through said frame along said fixed path, first and second inductive circuit elements fixedly mounted in said housing, means operative to electrically energize said inductive elements to establish substantially isolated flux fields thereabout, each said field disposed within the atmosphere surrounding its respective element within said housing and having a characteristic amplitude;

a first proximity switch target mounted in said housing for movement between a first position wherein said first target is within actuating proximity of said first inductive element and a second position wherein said first target is out of actuating proximity to said first inductive element by effecting changes in said first element characteristic amplitude;

a second proximity switch target mounted in said housing for movement between a first position wherein said second target is within actuating proximity of said second inductive element and a second position wherein said second target is out of actuating proximity to said second inductive element by effecting changes in said second element characteristic amplitude;

circuit means operative to generate said control signal as a function of said change in characteristic amplitudes;

a target actuator member engaging said rigid member and said first and second target to effect simultaneous reciprocal displacement of said first and second target between said respective remote and sensed positions when said rigid member alternately substantially arrives at one of its end limits of travel;

first abutment means on said rigid member, and second abutment means on said target actuator member, one of said abutment means comprising means on one of said members defining an elongate recess terminating at opposite ends in abutment shoulders normal to said fixed path and the other of said abutment means comprising a projection on the other of said members projecting from said other of said members normal to said fixed path through said slot in said frame into the recess of said one of said members between said abutment shoulders, said shoulders being spaced from each other by a distance such that upon movement of said rigid member to said first end limit one of said shoulders engages said projection and pushes said target member into said first position and upon movement of said rigid member to said second end limit the other of said shoulders engages said projection and pushes said target member into said second position.

27. The combination of claim 26, wherein said power actuated device comprises a double-acting fluid driven cylinder.

28. The combination of claim 26, wherein said first and second target switch members are disposed for reciprocal sliding movement parallel to said path.

29. The switch of claim 1, wherein said circuit means is operative to generate said control signal as a function of said change in both of said characteristic amplitudes.

30. The switch of claim 1, wherein said first and second target means are integrally formed from a single base member.

* * * * *